(12) United States Patent
Liu et al.

(10) Patent No.: US 12,094,862 B2
(45) Date of Patent: Sep. 17, 2024

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventors: Jia Liu, Yokohama (JP); Masahiko Hori, Yokohama (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 253 days.

(21) Appl. No.: 17/653,509

(22) Filed: Mar. 4, 2022

(65) Prior Publication Data

US 2023/0088828 A1 Mar. 23, 2023

(30) Foreign Application Priority Data

Sep. 21, 2021 (JP) .................. 2021-153093

(51) Int. Cl.
*H01L 25/16* (2023.01)
*H01L 23/00* (2006.01)

(52) U.S. Cl.
CPC ............ *H01L 25/167* (2013.01); *H01L 24/48* (2013.01); *H01L 2224/48137* (2013.01); *H01L 2224/48227* (2013.01)

(58) Field of Classification Search
CPC .................. H01L 25/167; H01L 24/48; H01L 2224/48137; H01L 2224/48227; H01L 23/3121; H01L 23/49827; H01L 25/072; H01L 25/16; H01L 24/05; H01L 24/06; H01L 24/29; H01L 24/32; H01L 24/73; H01L 25/18; H01L 2224/48091; H01L 24/49; H01L 2224/0603; H01L 2224/32145; H01L 2224/32225; H01L 2224/49111; H01L 2224/49113; H01L 2224/49175; H01L 2224/73265;
(Continued)

(56) References Cited

U.S. PATENT DOCUMENTS 8,412,006 B2 4/2013 Tay et al.
10,068,883 B2 9/2018 Kugiyama et al.
(Continued)

FOREIGN PATENT DOCUMENTS

JP H11-026806 A 1/1999
JP 2003-289108 A 10/2003
(Continued)

OTHER PUBLICATIONS

Japanese Office Action dated Jul. 2, 2024 in corresponding Japanese Patent Application 2021-153093 (with English Translation), 6 pages.

*Primary Examiner* — Elias Ullah
(74) *Attorney, Agent, or Firm* — Kim & Stewart LLP

(57) ABSTRACT

According to one embodiment, a semiconductor device includes: a substrate; a first MOSFET and a second MOSFET that are provided on a first surface of the substrate and have sources commonly coupled; a third MOSFET and a fourth MOSFET that are provided on the first surface of the substrate and have sources commonly coupled; a light receiver that is provided on the first surface of the substrate and is coupled to the first MOSFET, the second MOSFET, the third MOSFET, and the fourth MOSFET; and a light emitter that is provided on the light receiver.

11 Claims, 8 Drawing Sheets

(58) Field of Classification Search
CPC . H01L 2924/00014; H01L 2924/12043; H01L 2924/13091; H01L 2924/181
See application file for complete search history.

(56) References Cited

U.S. PATENT DOCUMENTS

| | | |
|---|---|---|
| 2007/0187629 A1 | 8/2007 | Matsuyama |
| 2021/0175221 A1 | 6/2021 | Tonedachi |
| 2021/0247567 A1 | 8/2021 | Fujihara et al. |

FOREIGN PATENT DOCUMENTS

| | | |
|---|---|---|
| JP | 2004-103654 A | 4/2004 |
| JP | 2005-167361 A | 6/2005 |
| JP | 2007-165621 A | 6/2007 |
| JP | 2013-120940 A | 6/2013 |
| JP | 6445940 B2 | 12/2018 |
| JP | 2021-089971 A | 6/2021 |
| JP | 2021-125670 A | 8/2021 |

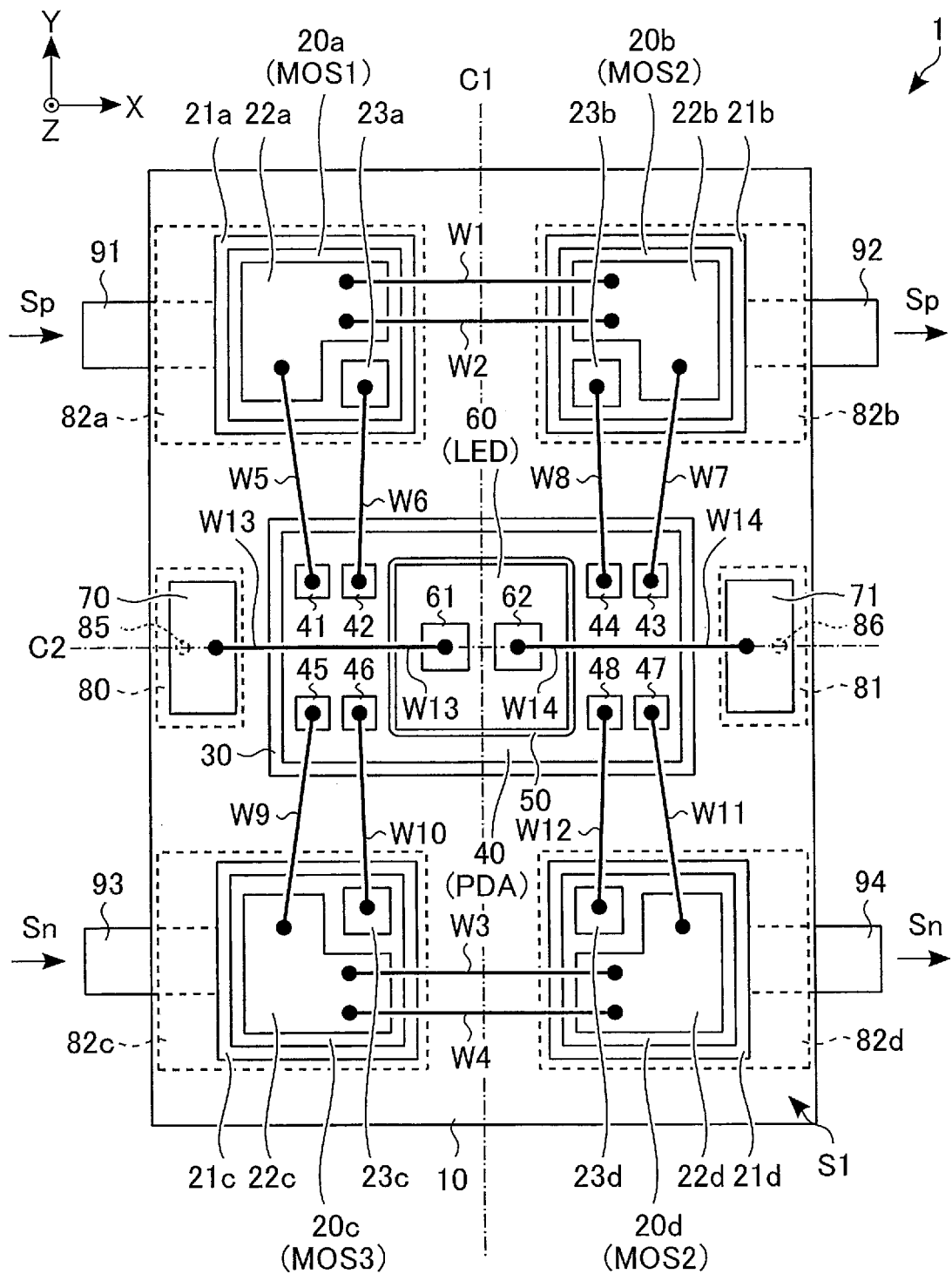
F I G. 2

SEMICONDUCTOR DEVICE

CROSS-REFERENCE TO RELATED APPLICATIONS

This application is based upon and claims the benefit of priority from Japanese Patent Application No. 2021-153093, filed Sep. 21, 2021, the entire contents of which are incorporated herein by reference.

FIELD

Embodiments described herein relate generally to a semiconductor device

BACKGROUND

A photo relay device is known as a semiconductor device. The photo relay device is a semiconductor relay device including a light emitting element and a light receiving element. The photo relay device is a contactless relay, and is used for transmission of an AC signal or a DC signal.

BRIEF DESCRIPTION OF THE DRAWINGS

FIG. 2 is a plan view of the photo relay device according to the first embodiment;

DETAILED DESCRIPTION

Figure 1:
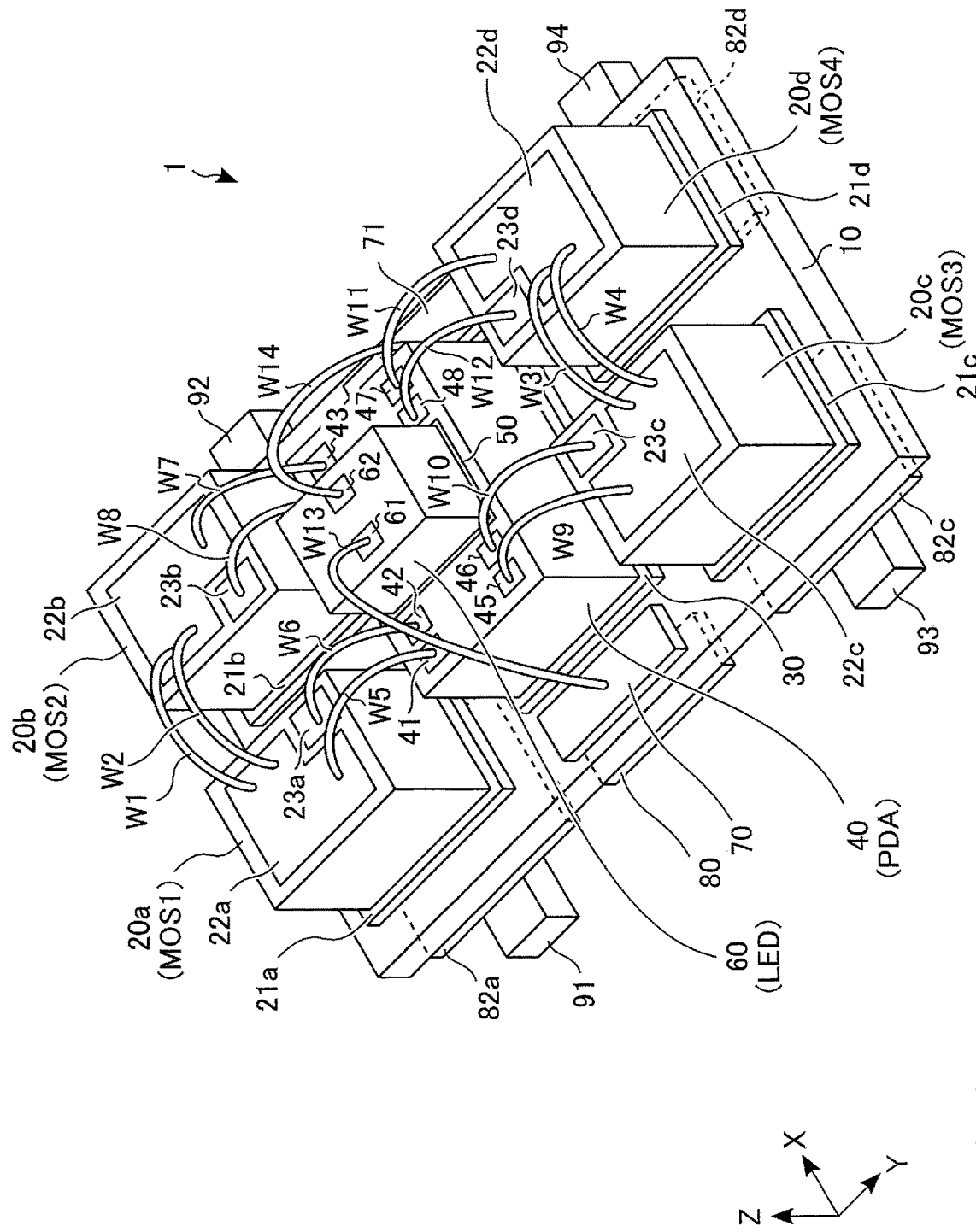
FIG. 1 is a perspective view of a photo relay device according to a first embodiment.

In general, according to one embodiment, a semiconductor device includes: a substrate; a first MOSFET and a second MOSFET that are provided on a first surface of the substrate and have sources commonly coupled; a third MOSFET and a fourth MOSFET that are provided on the first surface of the substrate and have sources commonly coupled; a light receiver that is provided on the first surface of the substrate and is coupled to the first MOSFET, the second MOSFET, the third MOSFET, and the fourth MOSFET; and a light emitter that is provided on the light receiver.

Hereinafter, embodiments will be described with reference to the drawings. In the following description, components having substantially the same function and configuration are denoted by the same reference numerals, and repeated description may be omitted. In addition, all, the descriptions of an embodiment are also applied to the description of another embodiment, unless expressly or explicitly excluded.

In the present specification and claims, when a first element is "coupled" to another second element, it includes that the first element is coupled to the second element directly or constantly or selectively via an element that is conductive.

1. First Embodiment

A first embodiment will be described. In the present embodiment, a photo relay device will be described as an example of a semiconductor device.

1.1 Overall Configuration

Figure 3:
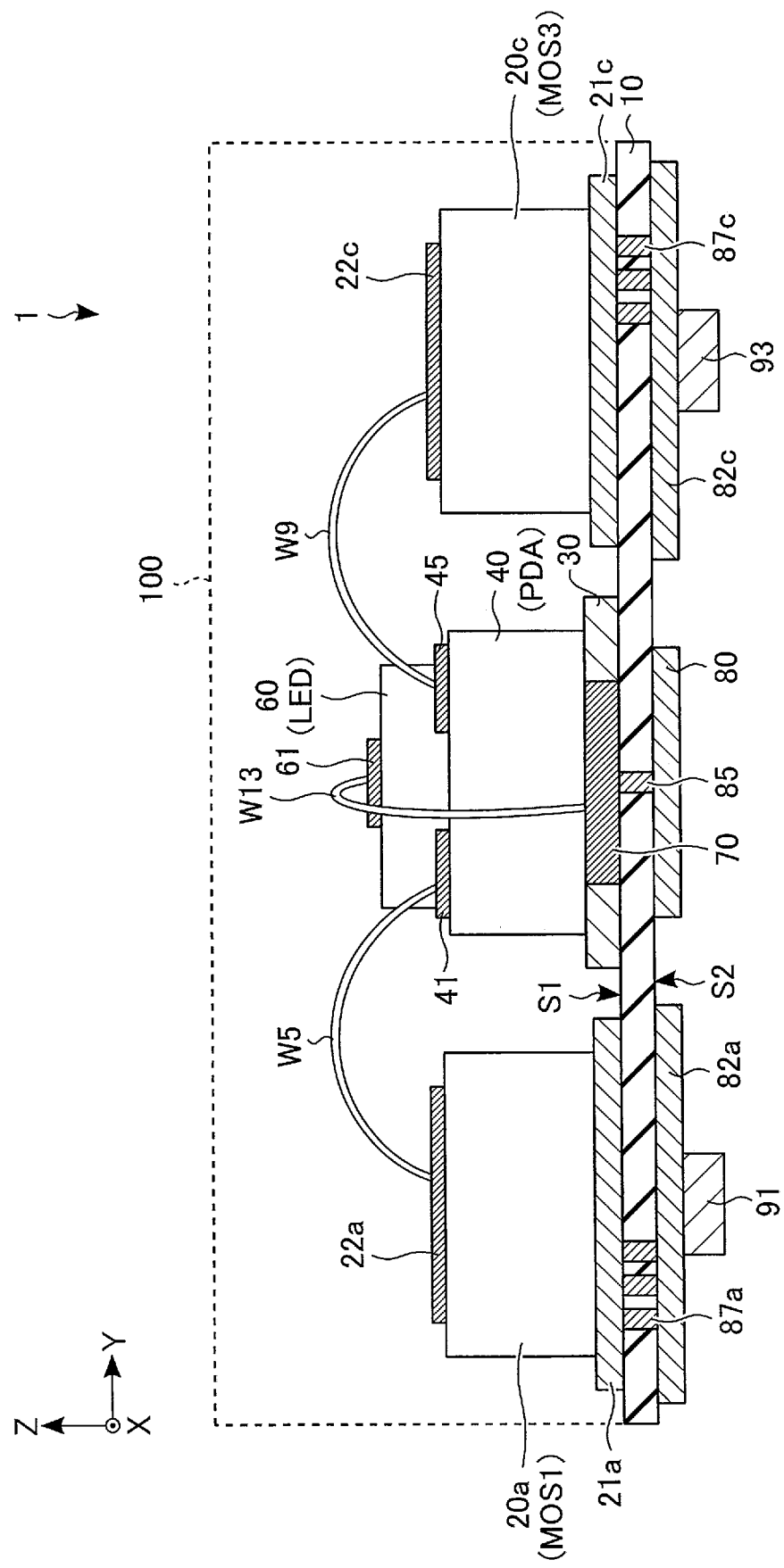
FIG. 3 is a cross-sectional view of the photo relay device according to the first embodiment.

First, an example of an overall configuration of a photo relay device 1 will be described with reference to FIGS. 1 to 3. FIG. 1 is a perspective view of the photo relay device 1. FIG. 2 is a plan view of the photo relay device 1. FIG. 3 is a cross-sectional view of the photo relay device 1. In the following description, a direction parallel to a substrate 10 of the photo relay device 1 is defined as an X direction. A direction parallel to the substrate 10 and intersecting the X direction is defined as a Y direction. A direction perpendicular to the substrate 10 and intersecting the X direction and the Y direction is defined as a Z direction. Note that, in FIGS. 1 and 2, a sealing resin is omitted.

As illustrated in FIGS. 1 to 3, the photo relay device 1 includes a substrate 10, four metal oxide semiconductor field effect transistors (MOSFETs) 20a, 20b, 20c, and 20d, a die pad 30, a light receiving element (light receiver) 40, an adhesive layer 50, a light emitting element (light emitter) 60, electrodes 70 and 71, input terminals 80 and 81, output terminals 82a, 82b, 82c, and 82d, wires W1 to W14, and a sealing resin 100. As illustrated in FIG. 2, in the present embodiment, the four MOSFETs 20a, 20b, 20c, and 20d, the die pad 30, the light receiving element 40, the light emitting element 60, and the electrodes 70 and 71 are disposed symmetrically with respect to a center axis C1 extending in the Y direction and a center axis C2 extending in the X direction. The center axes C1 and C2 pass through the center of a surface S1 of the substrate 10 facing the Z direction, for example.

The substrate 10 is, for example, a flexible printed circuit (FPC) using polyimide. Note that the substrate 10 is not limited to the flexible printed circuit. The substrate 10 has, for example, a plate shape extending in the X direction and the Y direction.

The MOSFETs 20a to 20d are, for example, enhancement type n-channel MOS transistors. A set of MOSFETs 20a and 20b of which sources are commonly coupled is used to control a first transmission path. Similarly, the set of MOSFETs 20c and 20d of which sources are commonly coupled is used to control a second transmission path. When the MOSFETs 20a and 20b are turned on, the photo relay device 1 transmits a signal Sp through the first transmission path. When the MOSFETs 20c and 20d are turned on, the photo relay device 1 transmits a signal Sn in the second transmission path. The signal Sn is, for example, an inverted signal of the signal Sp. In the present embodiment, a case where the photo relay device 1 includes the four MOSFETs 20a to 20d corresponding to the two transmission paths will be described. However, the present disclosure is not limited thereto. The photo relay device 1 may include two MOSFETs corresponding to the two transmission paths. That is, one MOSFET may be provided for one transmission path.

The MOSFET 20a (hereinafter, also referred to as "MOS1") includes electrodes 21a, 22a, and 23a. The electrode 21a functions as a drain electrode of the MOSFET 20a. The electrode 22a functions as a source electrode of the MOSFET 20a. The electrode 23a functions as a gate electrode of the MOSFET 20a. The electrode 21a is provided on the surface S1 of the substrate 10. That is, the electrode 21a is a die pad provided on the surface S1 of the substrate 10. The MOSFET 20a is provided on the electrode 21a. The electrode 22a and the electrode 23a are provided on a top surface of the MOSFET 20a, that is, a surface opposite to a surface in contact with the electrode 21a.

The MOSFET 20b (hereinafter, also referred to as "MOS2") has the same structure as the MOSFET 20a, for example. For example, the MOSFET 20b is disposed symmetrically with the MOSFET 20a with respect to the center axis C1.

The MOSFET 20b includes electrodes 21b, 22b, and 23b. The electrode 21b functions as a drain electrode of the MOSFET 20b. The electrode 22b functions as a source electrode of the MOSFET 20b. The electrode 23b functions as a gate electrode of the MOSFET 20b. The electrode 21b is provided on the surface S1 of the substrate 10. That is, the electrode 21b is a die pad provided on the surface S1 of the substrate 10. The MOSFET 20b is provided on the electrode 21b. The electrode 22b and the electrode 23b are provided on a top surface of the MOSFET 20b, that is, a surface opposite to a surface in contact with the electrode 21b. For example, the electrode 22b and the electrode 23b are disposed symmetrically with the electrode 22a and the electrode 23a of the MOSFET 20a with respect to the center axis C1.

The electrode 22a of the MOSFET 20a and the electrode 22b of the MOSFET 20b are commonly coupled via the wires W1 and W2. That is, the source of the MOSFET 20a and the source of the MOSFET 20b are commonly coupled. Note that the number of wires may be one or more.

The MOSFET 20c (hereinafter, also referred to as "MOS3") has the same structure as the MOSFET 20a, for example. For example, the MOSFET 20c is disposed symmetrically with the MOSFET 20a with respect to the center axis C2. In other words, the MOSFETs 20a and 20c are disposed symmetrically with the light receiving element 40 interposed therebetween.

The MOSFET 20c includes electrodes 21c, 22c, and 23c. The electrode 21c functions as a drain electrode of the MOSFET 20c. The electrode 22c functions as a source electrode of the MOSFET 20c. The electrode 23c functions as a gate electrode of the MOSFET 20c. The electrode 21c is provided on the surface S1 of the substrate 10. That is, the electrode 21c is a die pad provided on the surface S1 of the substrate 10. The MOSFET 20c is provided on the electrode 21c. The electrode 22c and the electrode 23c are provided on a top surface of the MOSFET 20c, that is, a surface opposite to a surface in contact with the electrode 21c. For example, the electrode 22c and the electrode 23c are disposed symmetrically with the electrode 22a and the electrode 23a of the MOSFET 20a with respect to the center axis C2.

The MOSFET 20d (hereinafter, also referred to as "MOS4") has the same structure as the MOSFET 20a, for example. For example, the MOSFET 20d is disposed symmetrically with the MOSFET 20c with respect to the center axis C1. Further, the MOSFET 20d is disposed symmetrically with the MOSFET 20b with respect to the center axis C2. In other words, the MOSFETs 20b and 20d are disposed symmetrically with the light receiving element 40 interposed therebetween.

The MOSFET 20d includes electrodes 21d, 22d, and 23d. The electrode 21d functions as a drain electrode of the MOSFET 20d. The electrode 22d functions as a source electrode of the MOSFET 20d. The electrode 23d functions as a gate electrode of the MOSFET 20d. The electrode 21d is provided on the surface S1 of the substrate 10. That is, the electrode 21d is a die pad provided on the surface S1 of the substrate 10. The MOSFET 20d is provided on the electrode 21d. The electrode 22d and the electrode 23d are provided on a top surface of the MOSFET 20d, that is, a surface opposite to a surface in contact with the electrode 21d. For example, the electrode 22d and the electrode 23d are disposed symmetrically with the electrode 22c and the electrode 23c of the MOSFET 20c with respect to the center axis C1. Further, the electrode 22d and the electrode 23d are disposed symmetrically with the electrode 22b and the electrode 23b of the MOSFET 20b with respect to the center axis C2.

The electrode 22c of the MOSFET 20c and the electrode 22d of the MOSFET 20d are commonly coupled via wires W3 and W4. That is, the source of the MOSFET 20c and the source of the MOSFET 20d are commonly coupled. Note that the number of wires may be one or more.

The die pad 30 is provided on the surface S1 of the substrate 10. For example, the center position of the die pad 30 can be matched with the intersection of the center axis C1 and the center axis C2. The die pad 30 may be a conductor, an insulating material, or a semiconductor material. The die pad 30 has a plate shape extending in the X direction and the Y direction. The die pad 30 is disposed between the MOSFET 20a and the MOSFET 20c and between the MOSFET 20b and the MOSFET 20d in the Y direction.

The light receiving element 40 is a photo diode array (PDA), a phototransistor, or the like. Hereinafter, a case where the light receiving element 40 is the PDA will be described. The light receiving element 40 is provided on the die pad 30. For example, the center position of the light receiving element 40 can be matched with the intersection of the center axis C1 and the center axis C2. The light receiving element 40 has a light receiving surface on a top surface, that is, a surface facing the Z direction opposite to a surface in contact with the die pad 30. The light receiving element 40 includes electrodes 41 to 48. The electrodes 41 to 48 are provided on the top surface of the light receiving element 40. The electrodes 41 to 44 are disposed side by side in the X direction. The electrode 42 is disposed adjacent to the electrode 41 in the X direction. The electrode 43 is disposed symmetrically with the electrode 41 with respect to the center axis C1. The electrode 44 is disposed symmetrically with the electrode 42 with respect to the center axis C1. In other words, for example, the electrodes 41 and 42 are disposed symmetrically with the electrodes 43 and 44 with the light emitting element 60 interposed therebetween. The electrodes 45 to 48 are disposed side by side in the X direction. The electrode 45 is disposed symmetrically with the electrode 41 with respect to the center axis C2. The electrode 46 is disposed symmetrically with the electrode 42 with respect to the center axis C2. The electrode 47 is disposed symmetrically with the electrode 45 with respect to the center axis C1 and symmetrically with the electrode 43 with respect to the center axis C2. The electrode 48 is disposed symmetrically with the electrode 46 with respect to the center axis C1 and symmetrically with the electrode 44 with respect to the center axis C2. That is, the electrodes 45 and 46 are disposed symmetrically with the electrodes 47 and 48 with the light emitting element 60 interposed therebetween.

For example, the electrodes 41, 43, 45, and 47 are commonly coupled in the light receiving element 40, and function as one of an anode electrode and a cathode electrode. Further, for example, the electrodes 42, 44, 46, and 48 are commonly coupled in the light receiving element 40, and function as the other of the anode electrode and the cathode electrode. The electrode 41 is coupled to the electrode 22a of the MOSFET 20a via a wire W5. The electrode 42 is coupled to the electrode 23a of the MOSFET 20a via a wire W6. The electrode 43 is coupled to the electrode 22b of the MOSFET 20*b* via a wire W7. The electrode 44 is coupled to the electrode 23*b* of the MOSFET 20*b* via a wire W8. The electrode 45 is coupled to the electrode 22*c* of the MOSFET 20*c* via a wire W9. The electrode 46 is coupled to the electrode 23*c* of the MOSFET 20*c* via a wire W10. The electrode 47 is coupled to the electrode 22*d* of the MOSFET 20*d* via a wire W11. The electrode 48 is coupled to the electrode 23*d* of the MOSFET 20*d* via a wire W12.

For example, the lengths of the wires W5, W7, W9, and W11 are substantially the same. Further, for example, the lengths of the wires W6, W8, W10, and W12 are substantially the same. The term "substantially the same" can include errors due to manufacturing variations.

The light emitting element 60 is, for example, a light emitting diode (LED). The light emitting element 60 is disposed on the top surface (light receiving surface) of the light receiving element 40 with the adhesive layer 50 interposed therebetween. For example, the center position of the light emitting element 60 can be matched with the intersection of the center axis C1 and the center axis C2. Note that an insulating material having a light transmitting property is used for the adhesive layer 50. A light irradiation surface of the light emitting element 60 faces a light receiving surface of the light receiving element 40, that is, a top surface of the light receiving element 40 with the adhesive layer 50 interposed therebetween. The light emitting element 60 includes electrodes 61 and 62. The electrodes 61 and 62 are provided on the top surface of the light emitting element 60, that is, a surface facing the Z direction opposite to the surface facing the light receiving element 40. For example, the electrodes 61 and 62 are disposed symmetrically with respect to the center axis C1 on the center axis C2. One of the electrodes 61 and 62 is an anode electrode of the light emitting element 60, and the other is a cathode electrode of the light emitting element 60.

The electrodes 70 and 71 are die pads provided on the surface S1 of the substrate 10. For example, the electrodes 70 and 71 are disposed symmetrically with respect to the center axis C1 on the center axis C2. In addition, the die pad 30 is disposed between the electrode 70 and the electrode 71 in the X direction, for example. The electrode 70 is coupled to the electrode 61 of the light emitting element 60 via a wire W13. The electrode 71 is coupled to the electrode 62 of the light emitting element 60 via a wire W14. The lengths of the wires W13 and W14 are substantially the same.

The input terminals 80 and 81 and the output terminals 82*a*, 82*b*, 82*c*, and 82*d* are provided on the surface S2 opposite to the surface S1 of the substrate 10.

The input terminals 80 and 81 are coupled to a DC power supply (not illustrated in the drawings) provided outside, for example. A voltage for controlling the photo relay device 1 (causing the light emitting element 60 to emit light) is applied to the input terminals 80 and 81. As illustrated in FIG. 3, the input terminal 80 is electrically coupled to the electrode 70 via a conductor 85 penetrating the substrate 10. Similarly, the input terminal 81 is electrically coupled to the electrode 71 via a conductor 86 penetrating the substrate 10.

The output terminals 82*a* to 82*d* are coupled to signal lines 91 to 94 of external circuits, respectively. The output terminals 82*a* and 82*b* are a set of output terminals corresponding to the first transmission path in differential transmission, and the output terminals 82*c* and 82*d* are a set of output terminals corresponding to the second transmission path in the differential transmission.

As illustrated in FIG. 3, the output terminal 82*a* is electrically coupled to the electrode 21*a* of the MOSFET 20*a* via a conductor 87*a* penetrating the substrate 10. Similarly, the output terminal 82*b* is electrically coupled to the electrode 21*b* of the MOSFET 20*b*. When the MOSFETs 20*a* and 20*b* are turned on, the output terminals 82*a* and 82*b* are electrically coupled. In addition, the output terminal 82*c* is electrically coupled to the electrode 21*c* of the MOSFET 20*c* via a conductor 87*c* penetrating the substrate 10. Similarly, the output terminal 82*d* is electrically coupled to the electrode 21*d* of the MOSFET 20*d*. When the MOSFETs 20*c* and 20*d* are turned on, the output terminals 82*c* and 82*d* are electrically coupled.

The wires W1 to W14 are made of a conductive material. Note that the wires W1 to W14 may be formed by wire bonding or may be wires of a flexible printed circuit.

As illustrated in FIG. 3, the sealing resin 100 covers and protects the MOSFETs 20*a* to 20*d*, the light receiving element 40, the light emitting element 60, the electrodes 70 and 71, and the wires W1 to W14 on the surface S1 of the substrate 10. Note that the sealing resin 100 may include a plurality of resin materials. For example, the sealing resin 100 may include a first sealing resin covering the light emitting element 60 and a second sealing resin covering the entire upper portion of the surface S1 of the substrate 10.

1.2 Circuit Configuration of Photo Relay Device

Figure 4:
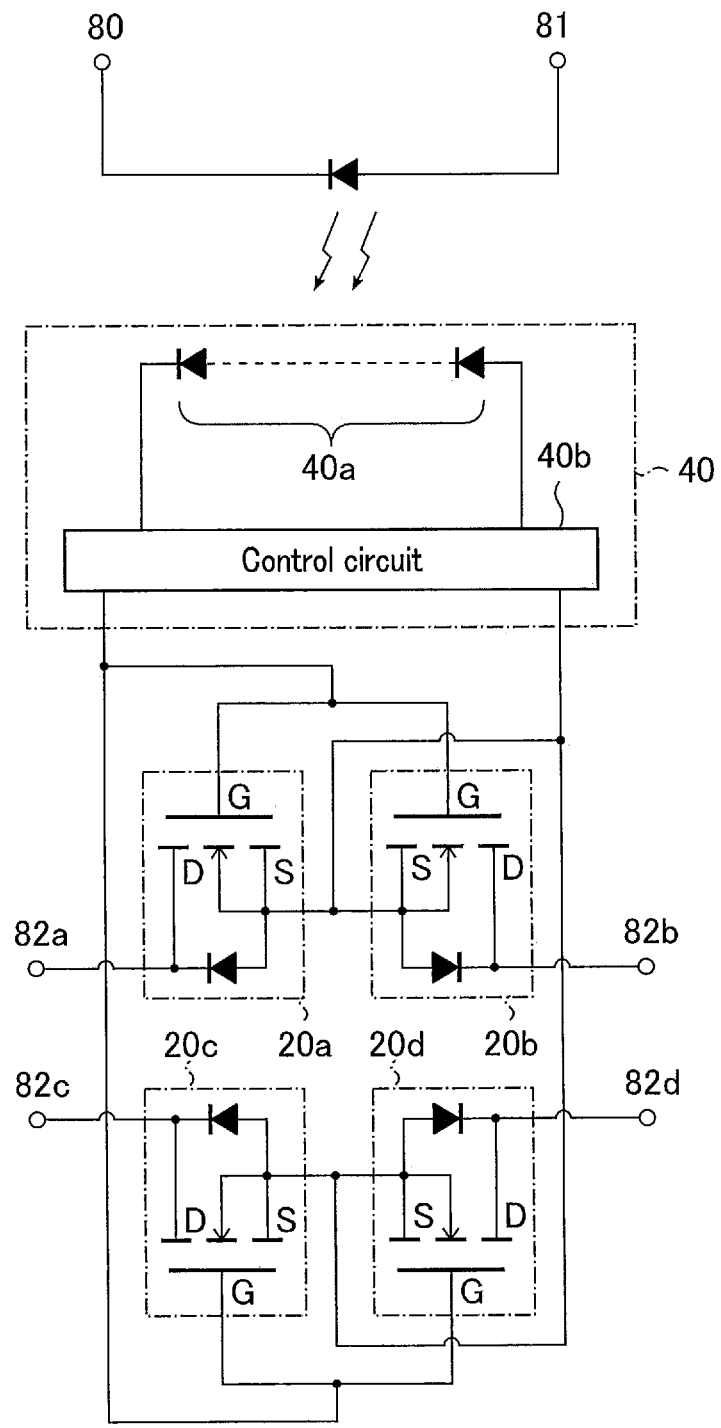
FIG. 4 is a circuit diagram of the photo relay device according to the first embodiment.

Next, an example of a circuit configuration of the photo relay device 1 will be described with reference to FIG. 4. FIG. 4 is a circuit diagram of the photo relay device 1.

As illustrated in FIG. 4, the light emitting element 60 is coupled to the input terminals 80 and 81. An input voltage for controlling the photo relay device 1 is applied to the input terminals 80 and 81.

The light receiving element 40 is, for example, a photodiode array including several to several tens of photodiodes 40*a* coupled in series and a control circuit 40*b*. Both ends of the plurality of photodiodes 40*a* coupled in series are coupled to the control circuit 40*b*.

The gates of the MOSFETs 20*a* to 20*d* are commonly coupled to an anode of the light receiving element 40. The sources of the MOSFETs 20*a* to 20*d* are commonly coupled to a cathode of the light receiving element 40. The drain of the MOSFET 20*a* is coupled to the output terminal 82*a*. The drain of the MOSFET 20*b* is coupled to the output terminal 82*b*. The drain of the MOSFET 20*c* is coupled to the output terminal 82*c*. The drain of the MOSFET 20*d* is coupled to the output terminal 82*d*.

When, in the input-side, light emitting element 60 is turned on (light emitting state), the light receiving element 40 that drives the MOSFETs 20*a* to 20*d* receives light from the light emitting element 60 and generates a voltage of, for example, 7 V to several ten V. Thereby, the MOSFETs 20*a* to 20*d* are turned on. As a result, the output terminals 82*a* and 82*b* are electrically coupled via the MOSFETs 20*a* and 20*b*. In addition, the output terminals 82*c* and 82*d* are electrically coupled via the MOSFETs 20*c* and 20*d*. On the other hand, when the light emitting element 60 is turned off, the MOSFETs 20*a* to 20*d* are turned off. As a result, the output terminals 82*a* and 82*b* are electrically decoupled. In addition, the output terminals 82*c* and 82*d* are electrically decoupled.

1.3 Application of Photo Relay Device

Figure 5:
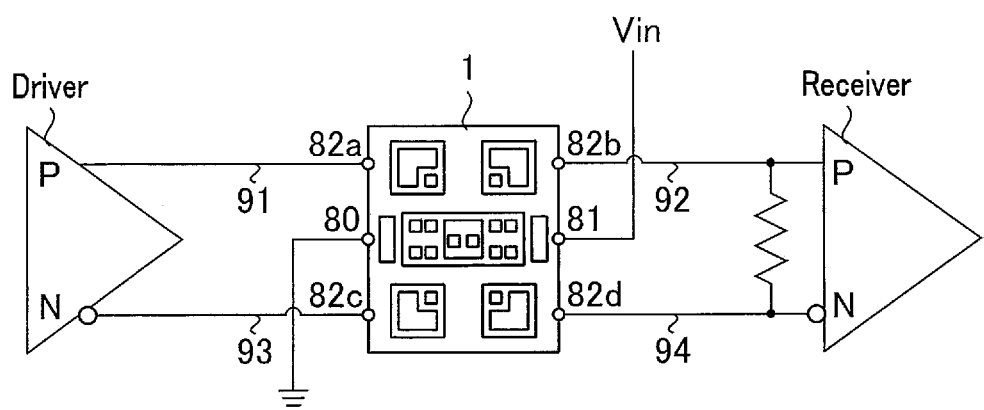
FIG. 5 is a diagram illustrating an application of the photo relay device.

Next, an application of the photo relay device 1 will be described with reference to FIG. 5. FIG. 5 is a diagram illustrating the application of the photo relay device.

As illustrated in FIG. 5, the photo relay device 1 is coupled to a driver and a receiver corresponding to differential transmission, and an input voltage Vin is applied thereto. More specifically, for example, the input terminal 80 of the photo relay device 1 is grounded (coupled to a ground voltage wire), and the input voltage Vin is applied to the input terminal 81. The output terminal 82a of the photo relay device 1 is coupled to a terminal P (for example, a non-inverting output terminal) of the driver via the signal line 91, and the output terminal 82c is coupled to a terminal N (for example, an inverting output terminal) of the driver via the signal line 93. In addition, the output terminal 82b of the photo relay device 1 is coupled to a terminal P (for example, a non-inverting input terminal) of the receiver via the signal line 92, and the output terminal 82d is coupled to a terminal N (for example, an inverting input terminal) of the receiver via the signal line 94.

1.4 Effects According to Present Embodiment

For example, in a case where a single-ended photo relay device including one light receiving element and two MOSFETs is used for a differential transmission signal that performs high-frequency transmission, one photo relay device is provided in each of the two transmission paths. In this case, due to mounting restrictions, the relatively large mounting distance and space are required to dispose two photo relay devices. For this reason, the mounting area increases, and the cost increases.

On the other hand, according to the configuration of the present embodiment, the photo relay device 1 includes the light receiving element 40, the light emitting element 60, the output terminals 82a and 82b and the MOSFETs 20a and 20b corresponding to one transmission path of the differential transmission, and the output terminals 82c and 82d and the MOSFETs 20c and 20d corresponding to the other transmission path. As a result, the photo relay device 1 can support the differential transmission.

Further, according to the configuration of the present embodiment, the four MOSFETs 20a to 20d can be controlled by one light receiving element 40. That is, the two transmission paths can be controlled by one light receiving element 40. Therefore, the number of components (the number of light receiving elements and light emitting elements) can be reduced as compared with the case of using the two single-ended photo relay devices. As a result, the mounting cost can be reduced.

Furthermore, the mounting area can be reduced by single packaging. Since mounting restrictions with peripheral components and arrangement restrictions with peripheral wires are reduced, convenience can be improved.

Furthermore, according to the configuration of the present embodiment, the MOSFETs 20a, 20b, 20c, and 20d can be disposed symmetrically with respect to the light receiving element 40. As a result, it is possible to reduce variations in the length of the wire coupling each electrode of the MOSFETs 20a, 20b, 20c, and 20d and the light receiving element 40. For this reason, variations in the open stubs can be reduced. Therefore, transmission characteristics of the photo relay device 1 can be improved.

2. Second Embodiment

Next, a second embodiment will be described. In the second embodiment, a configuration different from that of the first embodiment will be described. Hereinafter, differences from the first embodiment will be mainly described.

2.1 Overall Configuration

Figure 6:
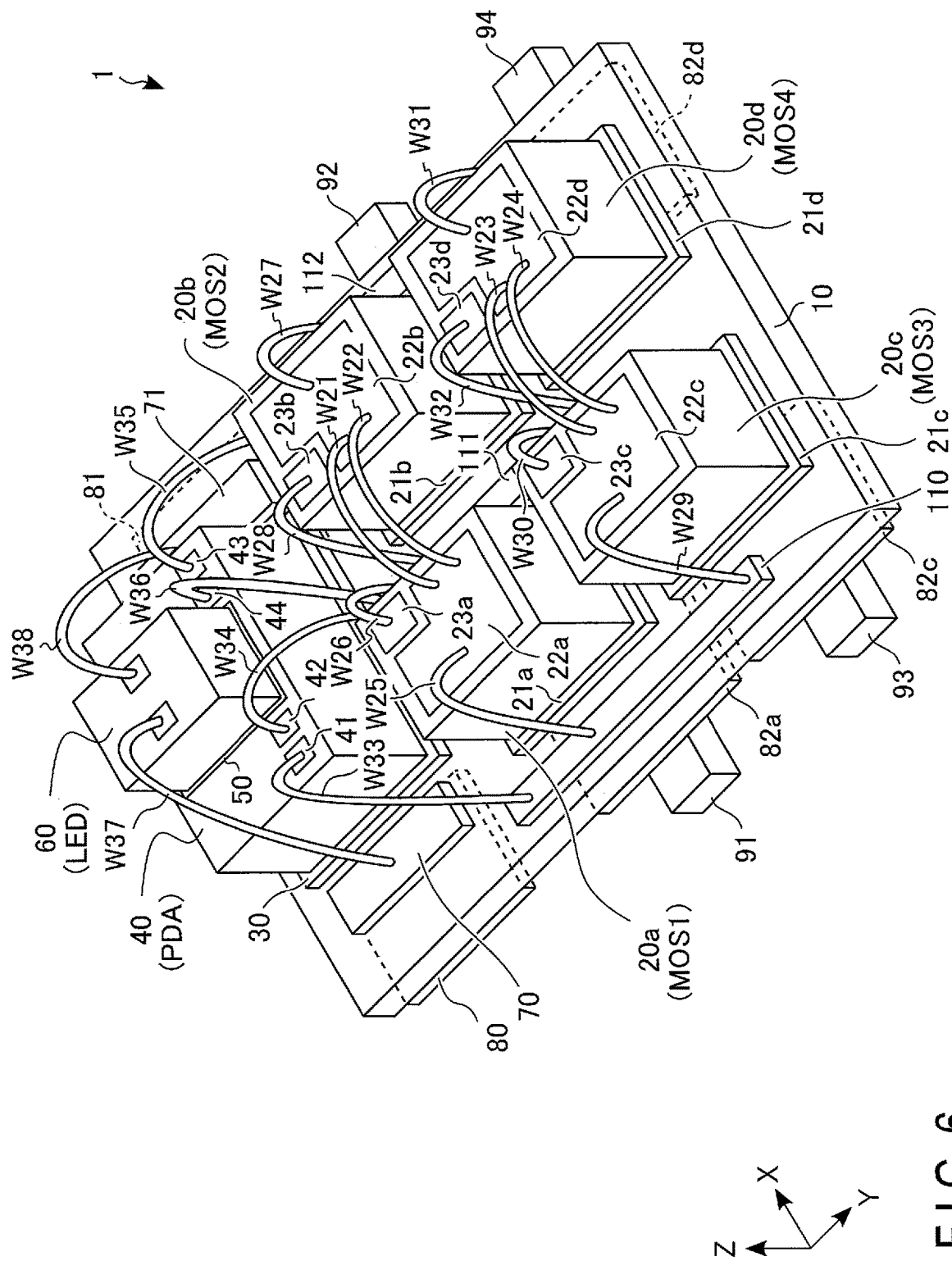
FIG. 6 is a perspective view of a photo relay device according to a second embodiment.
Figure 7:
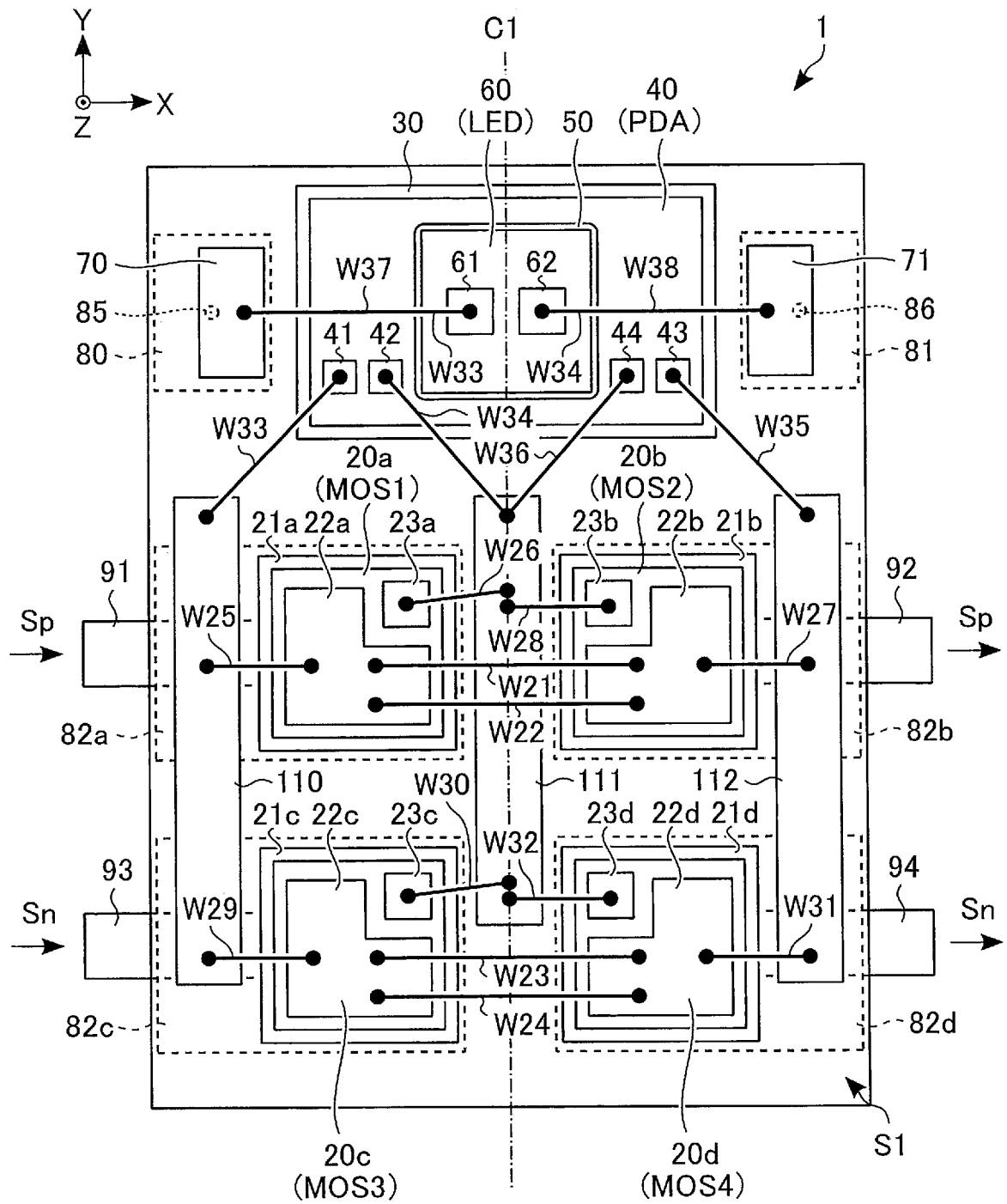
FIG. 7 is a plan view of the photo relay device according to the second embodiment.
Figure 8:
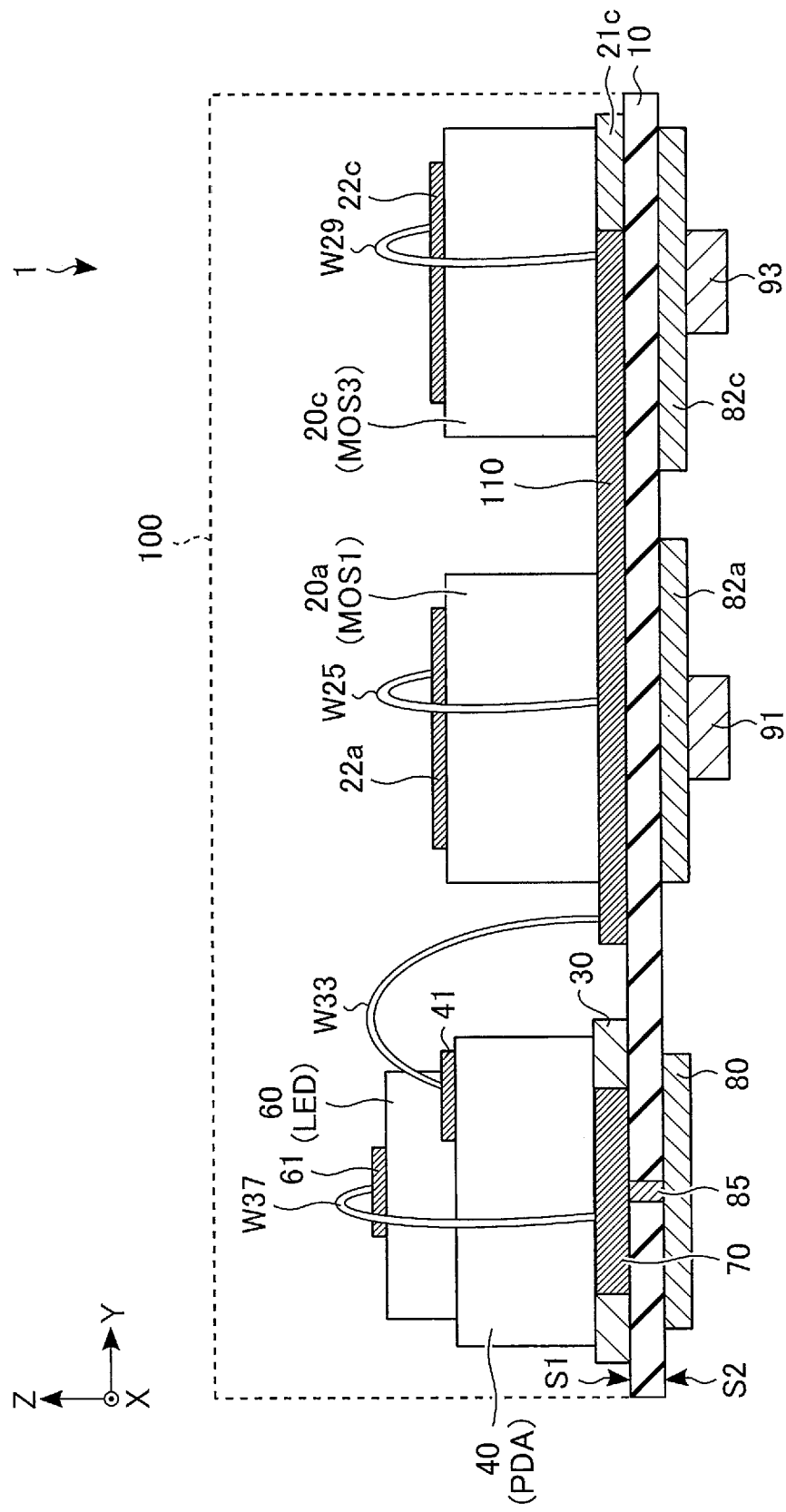
FIG. 8 is a cross-sectional view of the photo relay device according to the second embodiment.

An example of an overall configuration of a photo relay device 1 will be described with reference to FIGS. 6 to 8. FIG. 6 is a perspective view of the photo relay device 1. FIG. 7 is a plan view of the photo relay device 1. FIG. 8 is a cross-sectional view of the photo relay device 1. Note that, in FIGS. 6 and 7, a sealing resin is omitted.

As illustrated in FIGS. 6 to 8, the photo relay device 1 includes a substrate 10, four MOSFETs 20a, 20b, 20c, and 20d, a die pad 30, a light receiving element 40, an adhesive layer 50, a light emitting element 60, electrodes 70 and 71, input terminals 80 and 81, output terminals 82a, 82b, 82c, and 82d, wires W21 to W38, a sealing resin 100, and auxiliary electrodes 110, 111, and 112. As illustrated in FIG. 7, in the present embodiment, the MOSFETs 20a and 20b are disposed symmetrically with respect to a center axis C1 extending in a Y direction. Similarly, the MOSFETs 20c and 20d are disposed symmetrically with respect to the center axis C1.

In the present embodiment, the three auxiliary electrodes 110 to 112 extending in the Y direction are disposed side by side in an X direction on a surface S1 of the substrate 10. The lengths of the auxiliary electrodes 110 to 112 may be different from each other. Note that, in order to suppress variations in open stubs, the lengths of the auxiliary electrodes 110 and 112 are preferably the same. Further, in order to reduce the influence of the open stubs due to unnecessary wires, the length from a wire coupling position to an end portion is preferably shorter at both ends of the auxiliary electrodes 110, 111, and 112. The auxiliary electrodes 110 to 112 can include, for example, copper. For example, the auxiliary electrode 111 is disposed side by side with the light receiving element 40 and the light emitting element 60 on the center axis C1. The auxiliary electrodes 110 and 112 are disposed symmetrically with respect to the auxiliary electrode 111 (center axis C1).

The MOSFETs 20a and 20c are disposed side by side in the Y direction between the auxiliary electrode 110 and the auxiliary electrode 111. For example, the MOSFET 20c is disposed at a position farther from the light receiving element 40 and the light emitting element 60 than the MOSFET 20a. The MOSFETs 20b and 20d are disposed side by side in the Y direction between the auxiliary electrode 111 and the auxiliary electrode 112. For example, the MOSFET 20d is disposed at a position farther from the light receiving element 40 and the light emitting element 60 than the MOSFET 20b. That is, the MOSFET 20a is disposed symmetrically with the MOSFET 20b with respect to the auxiliary electrode 111 (center axis C1). Further, the MOSFET 20c is disposed symmetrically with the MOSFET 20d with respect to the auxiliary electrode ill (center axis C1).

The electrode 22a of the MOSFET 20a and the electrode 22b of the MOSFET 20b are commonly coupled via the wires W21 and W22. The electrode 22a of the MOSFET 20a is coupled to the auxiliary electrode 110 via the wire W25. The electrode 23a of the MOSFET 20a is coupled to the auxiliary electrode 111 via the wire W26. The electrode 22b of the MOSFET 20b is coupled to the auxiliary electrode 112 via the wire W27. The electrode 23b of the MOSFET 20b is coupled to the auxiliary electrode 111 via the wire W28.

The electrode 22c of the MOSFET 20c and the electrode 22d of the MOSFET 20d are commonly coupled via the wires W23 and W24. The electrode 22c of the MOSFET 20c is coupled to the auxiliary electrode 110 via the wire W29. The electrode 23c of the MOSFET 20c is coupled to the auxiliary electrode 111 via the wire W30. The electrode 22d of the MOSFET 20d is coupled to the auxiliary electrode 112 via the wire W31. The electrode 23d of the MOSFET 20d is coupled to the auxiliary electrode 111 via the wire W32.

For example, the lengths of the wires W25, W27, W29, and W31 are substantially the same. Further, for example, the lengths of the wires W26, W28, W30, and W32 are substantially the same.

The light receiving element 40 includes electrodes 41 to 44. The electrodes 41 to 44 are provided on a top surface of the light receiving element 40. The electrodes 41 to 44 are disposed side by side in the X direction. The electrode 42 is disposed adjacent to the electrode 41 in the X direction. The electrode 43 is disposed symmetrically with the electrode 41 with respect to the center axis C1. The electrode 44 is disposed symmetrically with the electrode 42 with respect to the center axis C1.

For example, the electrodes 41 and 43 are commonly coupled in the light receiving element 40, and function as one of an anode electrode and a cathode electrode. Further, for example, the electrodes 42 and 44 are commonly coupled in the light receiving element 40, and function as the other of the anode electrode and the cathode electrode. The electrode 41 is coupled to the auxiliary electrode 110 via a wire W33. The electrode 42 is coupled to the auxiliary electrode 111 via a wire W34. The electrode 43 is coupled to the auxiliary electrode 112 via a wire W35. The electrode 44 is coupled to the auxiliary electrode 111 via a wire W36.

For example, the lengths of the wires W33 and W35 are substantially the same. Further, for example, the lengths of the wires W34 and W36 are substantially the same.

The light emitting element 60 is disposed on the top surface (light receiving surface) of the light receiving element 40 with the adhesive layer 50 interposed therebetween. The electrodes 61 and 62 are disposed symmetrically with respect to the center axis C1, for example. One of the electrodes 61 and 62 is an anode electrode of the light emitting element 60, and the other is a cathode electrode of the light emitting element 60.

The electrodes 70 and 71 are disposed symmetrically with respect to the center axis C1. In addition, the die pad 30 is disposed between the electrode 70 and the electrode 71 in the X direction, for example. The electrode 70 is coupled to the electrode 61 of the light emitting element 60 via a wire W37. The electrode 71 is coupled to the electrode 62 of the light emitting element 60 via a wire W38. The lengths of the wires W37 and W38 are substantially the same.

2.2 Effects According to Present Embodiment

According to the configuration of the present embodiment, effects similar to those of the first embodiment can be obtained.

According to the configuration of the present embodiment, the photo relay device 1 includes the auxiliary electrodes 110 to 112. By coupling the four MOSFETs 20a to 20d and the light receiving element 40 via the auxiliary electrodes 110 to 112, the lengths of the wires coupling the MOSFETs 20a to 20d and the light receiving element 40 can be shortened. Therefore, the possibility of contact between the wires can be reduced. Further, electromagnetic coupling between the wires can also be suppressed. Therefore, the reliability of the photo relay device 1 can be improved.

Furthermore, according to the configuration of the present embodiment, the MOSFET 20a and the MOSFET 20b can be disposed symmetrically with respect to the auxiliary electrode 111. As a result, it is possible to reduce variations in the lengths of the wires coupled to the electrodes 22a and 23a of the MOSFET 20a and the wires coupled to the electrodes 22b and 23b of the MOSFET 20b. Similarly, the MOSFET 20c and the MOSFET 20d can be disposed symmetrically with respect to the auxiliary electrode 111. As a result, it is possible to reduce variations in the lengths of the wires coupled to the electrodes 22c and 23c of the MOSFET 20c and the wires coupled to the electrodes 22d and 23d of the MOSFET 20d. For this reason, variations in the open stubs can be reduced. Therefore, transmission characteristics of the photo relay device 1 can be improved.

3. Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a first MOSFET and a second MOSFET that are provided on a first surface of the substrate and have sources commonly coupled;
   a third MOSFET and a fourth MOSFET that are provided on the first surface of the substrate and have sources commonly coupled;
   a light receiver that is provided on the first surface of the substrate and is coupled to the first MOSFET, the second MOSFET, the third MOSFET, and the fourth MOSFET; and
   a light emitter that is provided on the light receiver.

2. The semiconductor device according to claim 1, wherein
   a first signal is transmitted via the first MOSFET and the second MOSFET, and
   a second signal is transmitted via the third MOSFET and the fourth MOSFET.

3. The semiconductor device according to claim 1, wherein
   the first MOSFET and the third MOSFET are disposed symmetrically with the light receiver interposed therebetween, and
   the second MOSFET and the fourth MOSFET are disposed symmetrically with the light receiver interposed therebetween.

4. The semiconductor device according to claim 1, wherein
   a length of a first wire coupling a gate of the first MOSFET and the light receiver, a length of a second wire coupling a gate of the second MOSFET and the light receiver, a length of a third wire coupling a gate of the third MOSFET and the light receiver, and a length of a fourth wire coupling a gate of the fourth MOSFET and the light receiver are the same.

5. The semiconductor device according to claim 1, wherein
   a light receiving surface of the light receiver faces an irradiation surface of the light emitter.

6. The semiconductor device according to claim 1, wherein
   when the light receiver receives light from the light emitter, the light receiver turns on the first MOSFET, the second MOSFET, the third MOSFET, and the fourth MOSFET.

7. The semiconductor device according to claim 1, further comprising:
   a first electrode, a second electrode, and a third electrode that are provided on the first surface of the substrate, extend in a first direction parallel to the substrate, and are disposed side by side in a second direction parallel to the substrate and intersecting the first direction, wherein the first MOSFET and the third MOSFET are disposed side by side in the first direction and are disposed between the first electrode and the second electrode, and the second MOSFET and the fourth MOSFET are disposed side by side in the first direction and are disposed between the second electrode and the third electrode.

8. The semiconductor device according to claim 7, wherein the first MOSFET and the second MOSFET are disposed symmetrically with the second electrode interposed therebetween, and the third MOSFET and the fourth MOSFET are disposed symmetrically with the second electrode interposed therebetween.

9. The semiconductor device according to claim 7, wherein a length of a fifth wire coupling a source of the first MOSFET and the first electrode, a length of a sixth wire coupling a source of the second MOSFET and the third electrode, a length of a seventh wire coupling a source of the third MOSFET and the first electrode, and a length of an eighth wire coupling a source of the fourth MOSFET and the third electrode are the same.

10. The semiconductor device according to claim 7, wherein the first electrode, the second electrode, and the third electrode are coupled to the light receiver.

11. The semiconductor device according to claim 7, wherein a gate of the first MOSFET, a gate of the second MOSFET, a gate of the third MOSFET, and a gate of the fourth MOSFET are coupled to the second electrode.

* * * * *